United States Patent
Zhang

(10) Patent No.: US 12,310,047 B1
(45) Date of Patent: May 20, 2025

(54) LATERALLY-DIFFUSED METAL-OXIDE-SEMICONDUCTOR DEVICES WITH A FIELD PLATE

(71) Applicant: GlobalFoundries Singapore Pte. Ltd., Singapore (SG)

(72) Inventor: Guowei Zhang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/907,770

(22) Filed: Oct. 7, 2024

(51) Int. Cl.
| | | |
|---|---|---|
| H01L 29/78 | (2006.01) | |
| H01L 29/06 | (2006.01) | |
| H01L 29/10 | (2006.01) | |
| H01L 29/40 | (2006.01) | |
| H01L 29/423 | (2006.01) | |
| H01L 29/49 | (2006.01) | |
| H01L 29/66 | (2006.01) | |
| H10D 30/01 | (2025.01) | |
| H10D 30/60 | (2025.01) | |
| H10D 62/10 | (2025.01) | |
| H10D 62/17 | (2025.01) | |
| H10D 64/00 | (2025.01) | |
| H10D 64/27 | (2025.01) | |
| H10D 64/66 | (2025.01) | |

(52) U.S. Cl.
CPC ........ H10D 30/603 (2025.01); H10D 30/0281 (2025.01); H10D 62/115 (2025.01); H10D 62/292 (2025.01); H10D 64/112 (2025.01); H10D 64/117 (2025.01); H10D 64/516 (2025.01); H10D 64/661 (2025.01)

(58) Field of Classification Search
CPC .. H10D 62/115; H10D 62/292; H10D 64/516; H10D 64/117; H10D 64/112; H10D 64/661; H10D 30/603; H10D 30/0281
See application file for complete search history.

(56) References Cited

U.S. PATENT DOCUMENTS

| | | |
|---|---|---|
| 10,573,744 B1 | 2/2020 | Zuniga et al. |
| 2012/0248528 A1 | 10/2012 | Wilson et al. |

(Continued)

OTHER PUBLICATIONS

R. K. Williams, M. N. Darwish, R. A. Blanchard, R. Siemieniec, P. Rutter and Y. Kawaguchi, "The Trench Power MOSFET: Part I—History, Technology, and Prospects," in IEEE Transactions on Electron Devices, vol. 64, No. 3, pp. 674-691, Mar. 2017, doi: 10.1109/TED.2017.2653239.

(Continued)

*Primary Examiner* — Peniel M Gumedzoe
(74) *Attorney, Agent, or Firm* — Thompson Hine LLP; Francois Pagette

(57) ABSTRACT

Structures for a laterally-diffused metal-oxide-semiconductor device and methods of forming same. The structure comprises a semiconductor substrate including a trench, a source and a drain in the semiconductor substrate, a gate laterally positioned between the trench and the source, and a field plate inside the trench. The field plate is laterally positioned between the gate and the drain. The structure further comprises a gate dielectric between the gate and the semiconductor substrate. The gate dielectric includes a first section adjacent to the field plate and a second section adjacent to the source. The first section is thicker than the second section.

20 Claims, 6 Drawing Sheets

(56) References Cited

U.S. PATENT DOCUMENTS

2016/0359029 A1* 12/2016 Zeng .................... H01L 29/7397
2017/0104097 A1* 4/2017 Park ...................... H01L 23/535
2017/0263766 A1* 9/2017 Xia ................... H01L 29/66681
2018/0090490 A1* 3/2018 Lin ...................... H01L 29/4175
2024/0162345 A1 5/2024 Pandey et al.

OTHER PUBLICATIONS

S. Mehrotra et al., "Towards ultimate scaling of LDMOS with Ultralow Specific On-resistance," 2020 32nd International Symposium on Power Semiconductor Devices and ICs (ISPSD), Vienna, Austria, 2020, pp. 42-45, doi: 10.1109/ISPSD46842.2020.9170198.
Yue Hu et al., "Numerical investigation on L-shaped vertical field plate in high-voltage LDMOS," Results in Physics, vol. 15, 2019, 102547, ISSN 2211-3797, https://doi.org/10.1016/j.rinp.2019.102547.
Mun, Bong Woong et al., "Laterally-Diffused Metal-Oxide-Semiconductor Devices With an Air Gap" filed on May 14, 2024, as a U.S. Appl. No. 18/663,563.

* cited by examiner

LATERALLY-DIFFUSED METAL-OXIDE-SEMICONDUCTOR DEVICES WITH A FIELD PLATE

BACKGROUND

The disclosure relates generally to semiconductor devices and integrated circuit fabrication and, more specifically, to structures for a laterally-diffused metal-oxide-semiconductor device and methods of forming same.

High-voltage integrated circuits typically require specialized device structures capable of withstanding higher voltages. Laterally-diffused metal-oxide-semiconductor devices incorporate features, such as an extended drain, that promote the higher voltage handling capability. The performance of a laterally-diffused metal-oxide-semiconductor device is dependent upon the drain-source on-resistance, which represents the total resistance between the drain and source. High values of the drain-source on-resistance degrade the performance of the laterally-diffused metal-oxide-semiconductor device.

Improved structures for a laterally-diffused metal-oxide-semiconductor device and methods of forming same are needed.

SUMMARY

In an embodiment, a structure for a laterally-diffused metal-oxide-semiconductor device is provided. The structure comprises a semiconductor substrate including a trench, a source and a drain in the semiconductor substrate, a gate laterally positioned between the trench and the source, and a field plate inside the trench. The field plate is laterally positioned between the gate and the drain. The structure further comprises a gate dielectric between the gate and the semiconductor substrate. The gate dielectric includes a first section adjacent to the field plate and a second section adjacent to the source. The first section is thicker than the second section.

In an embodiment, a method of forming a structure for a laterally-diffused metal-oxide-semiconductor device is provided. The method comprises forming a trench in a semiconductor substrate, forming a source and a drain in the semiconductor substrate, forming a gate dielectric, forming a gate laterally positioned between the trench and the source, and forming a field plate inside the trench. The field plate is laterally positioned between the gate and the drain, the gate dielectric is positioned between the gate and the semiconductor substrate, the gate dielectric includes a first section adjacent to the field plate and a second section adjacent to the source, and the first section is thicker than the second section.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
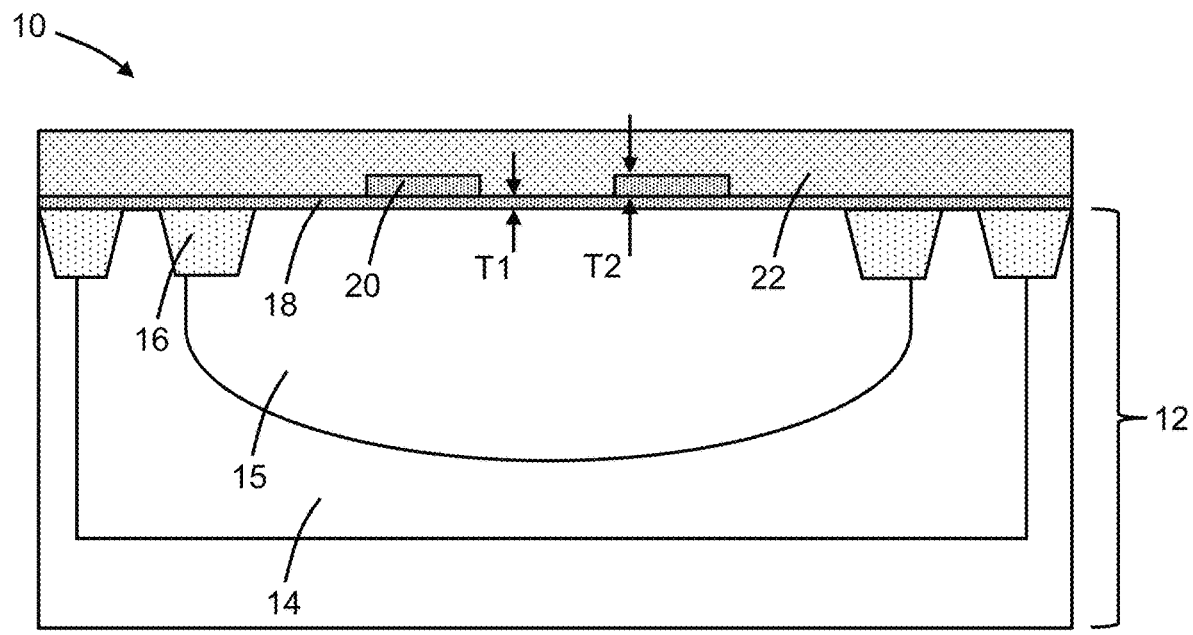
FIG. 1 is a cross-sectional view of a structure in accordance with embodiments of the invention.

With reference to FIG. 1 and in accordance with embodiments of the invention, a structure 10 for a laterally-diffused metal-oxide-semiconductor device includes a semiconductor substrate 12, a high-voltage well 14 in the semiconductor substrate 12, a well 15 that is inside the high-voltage well 14, and shallow trench isolation regions 16 in the semiconductor substrate 12. The semiconductor substrate 12 may be comprised of a semiconductor material, such as single-crystal silicon. The shallow trench isolation regions 16 may be formed by patterning shallow trenches in the semiconductor substrate 12 with lithography and etching processes, depositing a dielectric material, such as silicon dioxide, in the shallow trenches, and recessing and/or planarizing the deposited dielectric material.

In an embodiment, the high-voltage well 14 may be doped with a concentration of an n-type dopant, such as phosphorus, such that the high-voltage well 14 has n-type conductivity. In an embodiment, the high-voltage well 14 may be formed by introducing a dopant, such as an n-type dopant, by ion implantation into the semiconductor substrate 12. The implantation conditions, such as ion species, dose, and kinetic energy, may be selected to tune the electrical and physical characteristics of the high-voltage well 14.

The well 15 has an opposite conductivity type from the high-voltage well 14. In an embodiment, the well 15 may be lightly doped with a concentration of a p-type dopant, such as boron, such that the well 15 has p-type conductivity. In an embodiment, the well 15 may be formed by introducing a dopant, such as a p-type dopant, by ion implantation into the semiconductor substrate 12. The implantation conditions, such as ion species, dose, and kinetic energy, may be selected to tune the electrical and physical characteristics of the well 15.

A dielectric layer 18, which may have a thickness T1, may be deposited on the top surface of the semiconductor substrate 12. The dielectric layer 18 may be comprised of a dielectric material, such as silicon dioxide, that is an electrical insulator. A dielectric layer 20, which may have a thickness T2, may be deposited on the dielectric layer 18 and patterned into sections by lithography and etching processes. The dielectric layer 20 may be comprised of a dielectric material, such as silicon dioxide deposited by a high temperature oxide process, that is an electrical insulator. A layer 22 is deposited over the dielectric layer 18 and the patterned dielectric layer 20. The layer 22 may be comprised of a semiconductor material, such as polycrystalline silicon.

Figure 2:
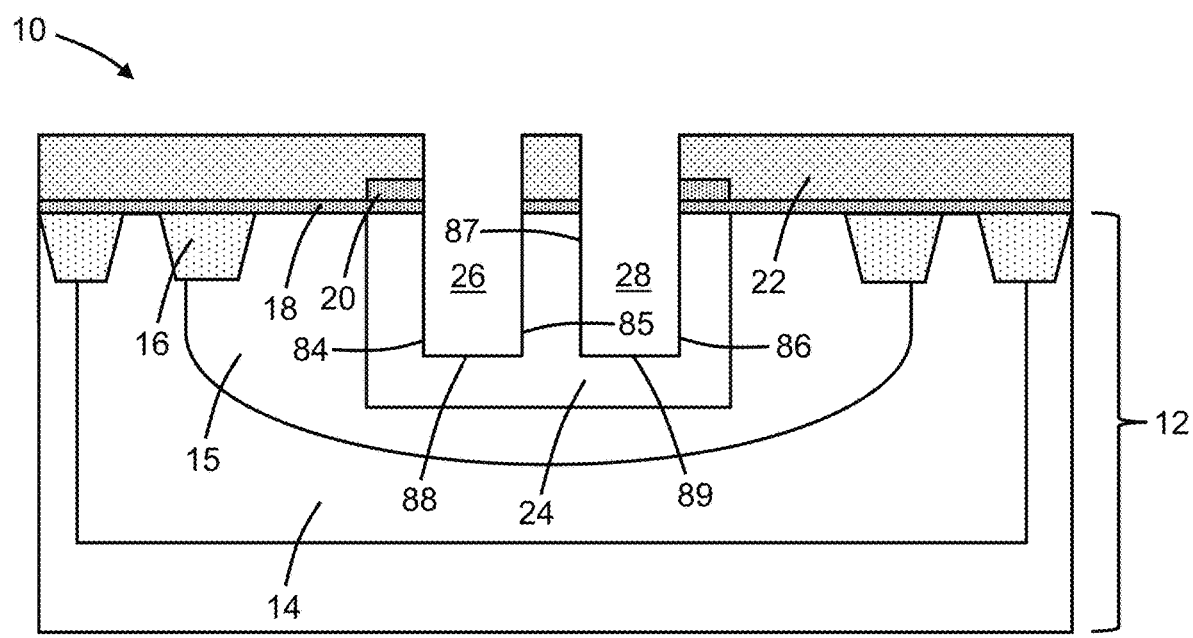
FIG. 2 is a cross-sectional view of the structure at a fabrication stage subsequent to FIG. 1.

With reference to FIG. 2 in which like reference numerals refer to like features in FIG. 1 and at a subsequent fabrication stage, a drift well 24 may be formed in a central portion of the well 15. The drift well 24 is oppositely doped from the well 15. In an embodiment, the drift well 24 may be lightly doped with a concentration of a p-type dopant, such as boron, such that the drift well 24 has p-type conductivity. In an embodiment, the drift well 24 may be formed by introducing a dopant, such as a p-type dopant, by ion implantation into the semiconductor substrate 12. The implantation conditions, such as ion species, dose, and kinetic energy, may be selected to tune the electrical and physical characteristics of the drift well 24.

Trenches 26, 28 may be patterned by lithography and etching processes in portions of the semiconductor substrate 12 and, more specifically, in portions of the drift well 24. To that end, an etch mask may be formed by a lithography process over the semiconductor substrate 12. The etch mask may include a layer of a photoresist applied by a spin-coating process, pre-baked, exposed to light projected through a photomask, baked after exposure, and developed with a chemical developer to define openings at the intended locations for the trenches 26, 28. An etching process is used to form the trenches 26, 28 at the location of the openings in the etch mask. The etch mask may be stripped after forming the trenches 26, 28.

The trenches 26, 28 extend partially through the drift well 24. A portion of the drift well 24 is laterally positioned between the trench 26 and the trench 28. The trench 26 has a sidewall 84 and an opposite sidewall 85, and the trench 26 has a sidewall 86 and an opposite sidewall 87. The sections of the dielectric layer 20 and the partially-overlapped sections of the dielectric layer 18 are respectively aligned at their respective side edges with the sidewall 84 of the trench 26 and the sidewall 86 of the trench 28. The trench 26 has a trench bottom 88 and the trench 28 has a trench bottom 89 that may be located at the same depth as the trench bottom 88.

Figure 3:
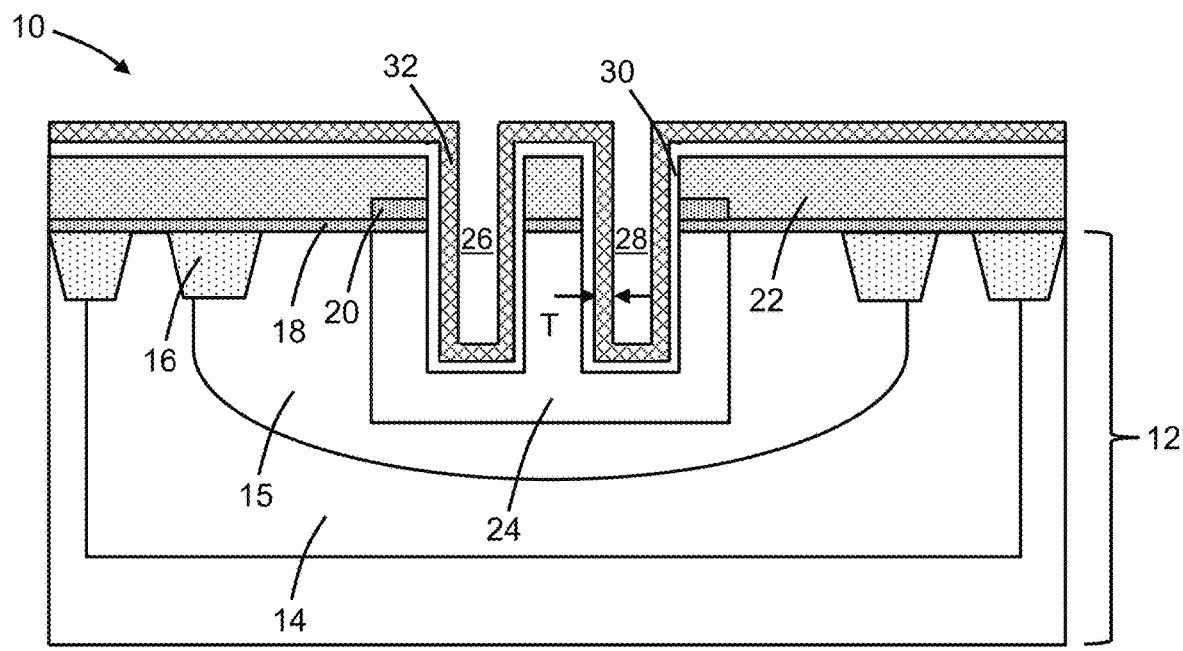
FIG. 3 is a cross-sectional view of the structure at a fabrication stage subsequent to FIG. 2.

With reference to FIG. 3 in which like reference numerals refer to like features in FIG. 2 and at a subsequent fabrication stage, a layer 30 may be deposited that includes portions that coat the trenches 26, 28. The layer 30 may be comprised of a dielectric material, such as silicon dioxide, that is an electrical insulator and that may have a conformal thickness. A layer 32 may be subsequently deposited that includes portions on the layer 30 that coat the trenches 26, 28. The layer 32, which may be comprised of a semiconductor material such as polycrystalline silicon, may have a conformal thickness T. The layer 30 is positioned inside the trenches 26, 28 between the layer 32 and the adjacent portions of the semiconductor substrate 12 to provide electrical isolation for the layer 32.

Figure 4:
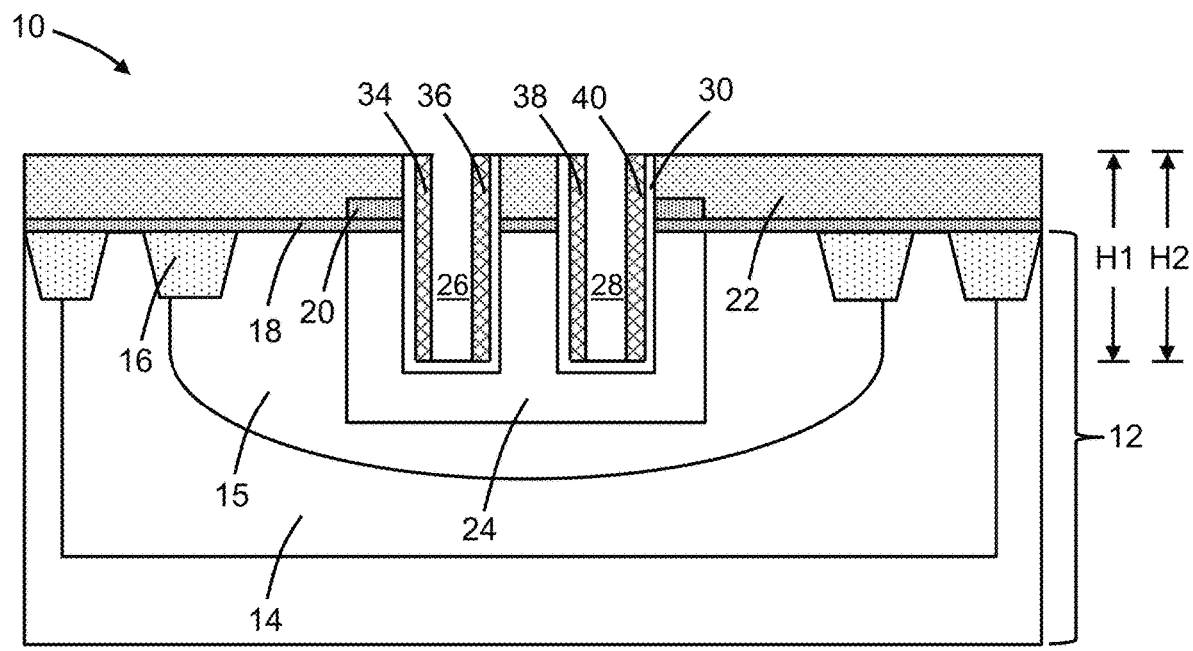
FIG. 4 is a cross-sectional view of the structure at a fabrication stage subsequent to FIG. 3.

With reference to FIG. 4 in which like reference numerals refer to like features in FIG. 3 and at a subsequent fabrication stage, the layer 30 and the layer 32 may be etched by one or more etching processes. In particular, field plates 34, 36 and field plates 38, 40 may be formed inside the trenches 26, 28 by etching the layer 32. In an embodiment, the field plates 34, 36 and field plates 38, 40 may be formed by an anisotropic etching process, such as a reactive ion etching process. The field plate 34 has a height H1 relative to the portion of the layer 30 at the trench bottom 88 of the trench 26 (FIG. 2), and the field plate 40 also has a height H1 relative to the portion of the layer 30 at the trench bottom 89 of the trench 28 (FIG. 2). The field plate 36 has a height H2 relative to the portion of the layer 30 at the portion of the layer 30 at the trench bottom 88 of the trench 26, the field plate 38 also has a height H2 relative to the portion of the layer 30 at the trench bottom 89 of the trench 28, and the height H2 is equal to the height Hlat the juncture of the process flow. The field plate 34 may extend parallel to the field plate 36, and the field plate 38 may extend parallel to the field plate 40.

Figure 5:
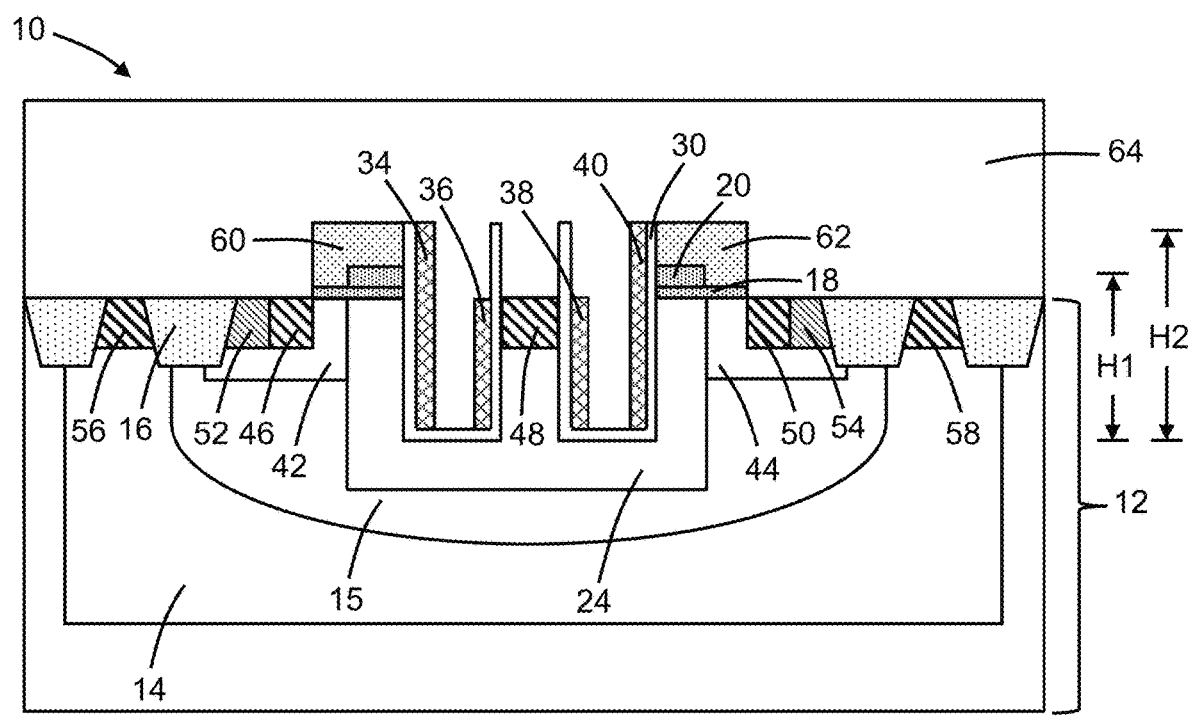
FIG. 5 is a cross-sectional view of the structure at a fabrication stage subsequent to FIG. 4.

With reference to FIG. 5 in which like reference numerals refer to like features in FIG. 4 and at a subsequent fabrication stage, wells 42, 44 may be formed in respective portions of the semiconductor substrate 12 laterally adjacent to opposite sides of the drift well 24. The drift well 24 is laterally arranged between the well 42 and the well 44. In an embodiment, the wells 42, 44 may contain a concentration of a p-type dopant, such as boron, to provide p-type conductivity. The wells 42, 44 may be formed by implanting ions, such as ions including the p-type dopant, with an implantation mask having openings defining the intended locations for the wells 42, 44 in the semiconductor substrate 12. The implantation conditions, such as ion species, dose, and kinetic energy, may be selected to tune the electrical and physical characteristics of the wells 42, 44. The wells 42, 44 may provide body regions of the laterally-diffused metal-oxide-semiconductor device.

Doped regions 46, 48, 50, doped regions 52, 54, and doped regions 56, 58 are formed in respective portions of the semiconductor substrate 12. More specifically, the doped region 46 and the doped region 52 are disposed in portions of the well 42, the doped region 50 and the doped region 54 are disposed in portions of the well 44, and the doped region 48 is disposed in a portion of the drift well 24 laterally between the trench 26 and the trench 28. The doped regions 52, 54 may have an opposite conductivity type from the doped regions 46, 48, 50 and an opposite conductivity type from the doped regions 56, 58. The doped region 46 may abut and adjoin the doped region 52, and the doped region 50 may abut and adjoin the doped region 54. The doped regions 52, 54 may provide low-resistance connections to the wells 42, 44. The doped regions 56, 58 may provide low-resistance connections to the high-voltage well 14.

The doped region 46 and the doped region 50 may have an opposite conductivity type from the wells 42, 44. The doped region 50 may be doped to the same conductivity type as the drift well 24 but at a higher dopant concentration. The doped region 52 and the doped region 54 may have that same conductivity type as the wells 42, 44 but at a higher dopant concentration. The doped regions 56, 58 may be doped to the same conductivity type as the high-voltage well 14 but at a higher dopant concentration.

In an embodiment, the doped regions 46, 48, 50 and the doped regions 56, 58 may contain a concentration of an n-type dopant, such as phosphorus, to provide n-type conductivity. The doped regions 46, 48, 50 and the doped regions 56, 58 may be concurrently formed by selectively implanting ions, such as ions including the n-type dopant, with an implantation mask having openings defining the intended locations for the doped regions 46, 48, 50 and the doped regions 56, 58 in the semiconductor substrate 12. The implantation conditions, such as ion species, dose, and kinetic energy, may be selected to tune the electrical and physical characteristics of the doped regions 46, 48, 50 and the doped regions 56, 58.

In an embodiment, the doped regions 52, 54 may contain a concentration of a p-type dopant, such as boron, to provide p-type conductivity. The doped regions 52, 54 may be formed by selectively implanting ions, such as ions including the p-type dopant, with an implantation mask having openings defining the intended locations for the doped regions 52, 54 in the semiconductor substrate 12. The implantation conditions, such as ion species, dose, and kinetic energy, may be selected to tune the electrical and physical characteristics of the doped regions 52, 54.

The doped region 46 and the doped region 50 may represent sources of the laterally-diffused metal-oxide-semiconductor device and the doped region 48 may represent a drain of the laterally-diffused metal-oxide-semiconductor device. The field plate 36 is positioned adjacent to the doped region 48, the field plate 38 is also positioned adjacent to the doped region 48, the doped region 48 is laterally positioned between the field plate 36 and the field plate 38, and portions of the dielectric material of the layer 30 may separate the doped region 48 from the field plates 36, 38.

The field plate 36 and the field plate 38 may be recessed and shortened by lithography and etching processes that etch and partially remove the semiconductor material forming the field plates 36, 38. The field plate 34 and the field plate 40 may be protected by an etch mask during the etching process and retain the original height H1. The height H1 of the field plate 34 is greater than the height H2 of the field plate 36, and the height H1 of the field plate 40 is greater than the height H1 of the field plate 38. The shortened field plate 36 and the shortened field plate 38 are positioned adjacent to the doped region 48 with the doped region 48 laterally positioned between the shortened field plate 36 and the shortened field plate 38. The field plate 34 and the field plate 36 are laterally positioned between the doped region 46 and the doped region 48, and the field plate 38 and the field plate 40 are laterally positioned between the doped region 48 and the doped region 50. In an embodiment, the field plate 34 and the field plate 36 may have respective top surfaces that are coplanar or substantially coplanar with each other and with the top surface of the semiconductor substrate 12.

Gates 60, 62 are formed by patterning the layer 22 with lithography and etching processes. The dielectric layer 18 is also patterned into sections when forming the gates 60, 62 and the sections of the dielectric layer 20 overlapped by the layer 22 are preserved when forming the gates 60, 62. The field plate 34 is positioned adjacent to the gate 60, and the field plate 40 is positioned adjacent to the gate 62.

The gate 60 overlaps with a section of the dielectric layer 18 and a section of the patterned dielectric layer 20 disposed between the gate 60 and the section of the dielectric layer 18. The overlapped section of the dielectric layer 20 and the overlapped section of the patterned dielectric layer 18 provide a dual-thickness gate dielectric having a thicker section adjacent to the field plate 34 with a thickness equal to the sum of T1 and T2 (FIG. 1) and a thinner section adjacent to the doped region 46 with a thickness equal to T1.

The gate 62 overlaps with a section of the dielectric layer 18 and a section of the patterned dielectric layer 20 disposed between the gate 62 and the section of the dielectric layer 18. The overlapped section of the dielectric layer 20 and the overlapped section of the patterned dielectric layer 18 provide a dual-thickness gate dielectric having a thicker section adjacent to the field plate 40 with a thickness equal to the sum of T1 and T2 and a thinner section adjacent to the doped region 50 with a thickness equal to T1.

The doped region 46, representing a source of the laterally-diffused metal-oxide-semiconductor device, is laterally positioned adjacent to the sidewall 84 of the trench 26 (FIG. 2). The doped region 50, representing another source of the laterally-diffused metal-oxide-semiconductor device, is laterally positioned adjacent to the sidewall 86 of the trench 28 (FIG. 2). The doped region 48, representing a drain of the laterally-diffused metal-oxide-semiconductor device, is laterally positioned between the sidewall 85 of the trench 26 and the sidewall 87 of the trench 28 (FIG. 2). The gate 60 is laterally positioned between the doped region 46 and the sidewall 84 of the trench 26. The gate 62 is laterally positioned between the doped region 50 and the sidewall 86 of the trench 28. The gate dielectric of the gate 60 has a side edge that is aligned with the sidewall 84 of the trench 26. The gate dielectric of the gate 62 has a side edge that is aligned with the sidewall 86 of the trench 28.

The field plates 34, 36, 38, 40 may be slabs that extend parallel to the length of the gates 60, 62. The field plate 34 is laterally positioned between the gate 60 and the shorter field plate 36. The field plate 40 is laterally positioned between the gate 62 and the shorter field plate 38. All field plates 34, 36, 38, 40 are laterally positioned between the gate 60 and the gate 62. All field plates 34, 36, 38, 40 are laterally positioned between the doped region 46 and the doped region 50.

A dielectric layer 64 may be deposited on the semiconductor substrate 12. The dielectric layer 64 may be comprised of a dielectric material, such as silicon dioxide, that is an electrical insulator. Portions of the dielectric layer 64 may fill the open space between the field plate 34 and the field plate 36, as well as the open space between the field plate 38 and the field plate 40. The dielectric material of the dielectric layer 18 and the dielectric material of the dielectric layer 64 fully surround and encase the field plates 34, 36 and the field plates 38, 40.

Figure 6:
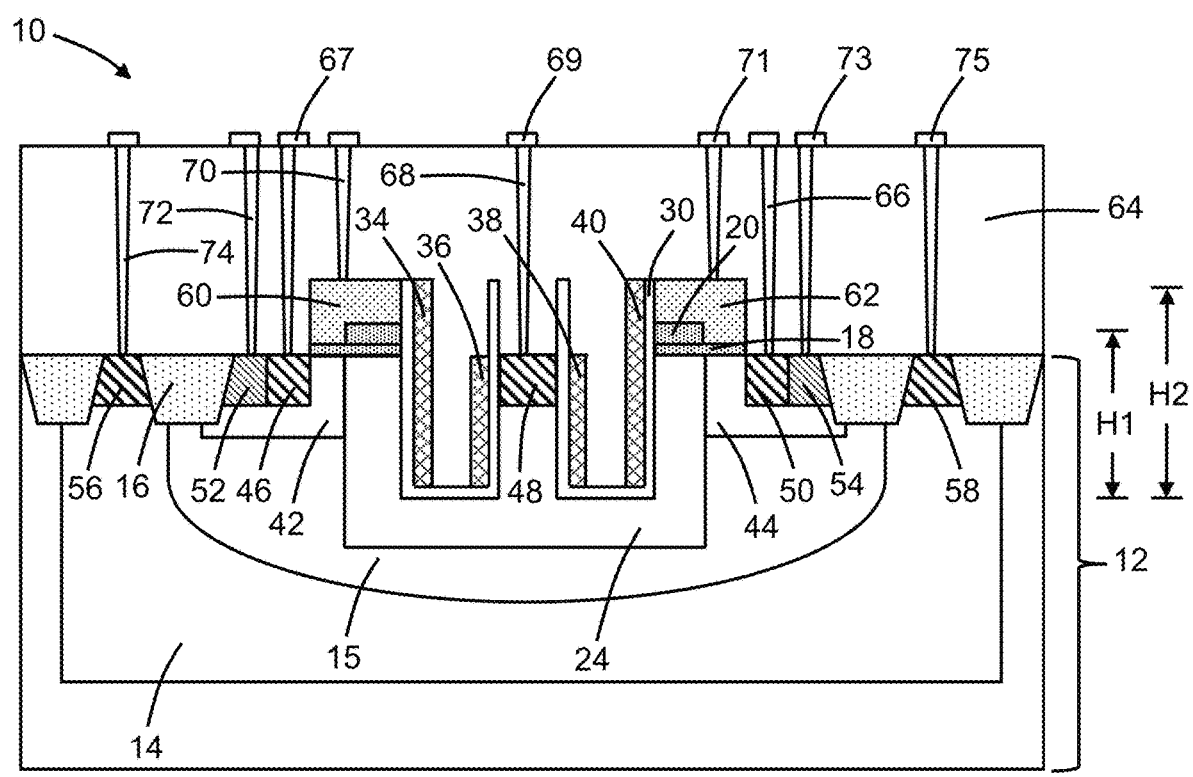
FIG. 6 is a cross-sectional view of the structure at a fabrication stage subsequent to FIG. 5.

With reference to FIG. 6 in which like reference numerals refer to like features in FIG. 5 and at a subsequent fabrication stage, contacts 66 may be formed that physically and electrically couple the doped region 46 and the doped region 50, which represent sources of the laterally-diffused metal-oxide-semiconductor device, with metal features 67. Contacts 68 may be formed that physically and electrically couple the doped region 48, which represent a drain of the laterally-diffused metal-oxide-semiconductor device, with one or more metal features 69. Contacts 70 may be formed that physically and electrically couple the gates 60, 62 of the laterally-diffused metal-oxide-semiconductor device with metal features 71. Contacts 72 may be formed that physically and electrically couple the doped regions 52, 54 with metal features 73. Contacts 74 may be formed that physically and electrically couple the doped regions 56, 58 with metal features 75. The metal features 67, 69, 71, 73, 75 may be arranged in a metallization level of a back-end-of-line stack formed over the dielectric layer 64.

The structure 10 may exhibit improved performance in comparison with a conventional laterally-diffused metal-oxide-semiconductor device. For example, the field plates 34, 36 and the field plates 38, 40 may cause a uniform distribution of the electric field in the drift well 24 during operation of the laterally-diffused metal-oxide-semiconductor device. As another example, the drift well 24 is interrupted by the introduction of the trenches 26, 28 between the sources and the drain, which requires charge carriers to navigate about the trenches 26, 28 when traveling between the sources and the drain. As a result, the drain-source on-resistance and the size of the laterally-diffused metal-oxide-semiconductor device may be reduced. As another example, the addition of the dielectric layer 20 that thickens the gate dielectric at the edges of the gates 60, 62 may protect against gate breakdown arising from high electric fields during operation of the laterally-diffused metal-oxide-semiconductor device.

Figure 7:
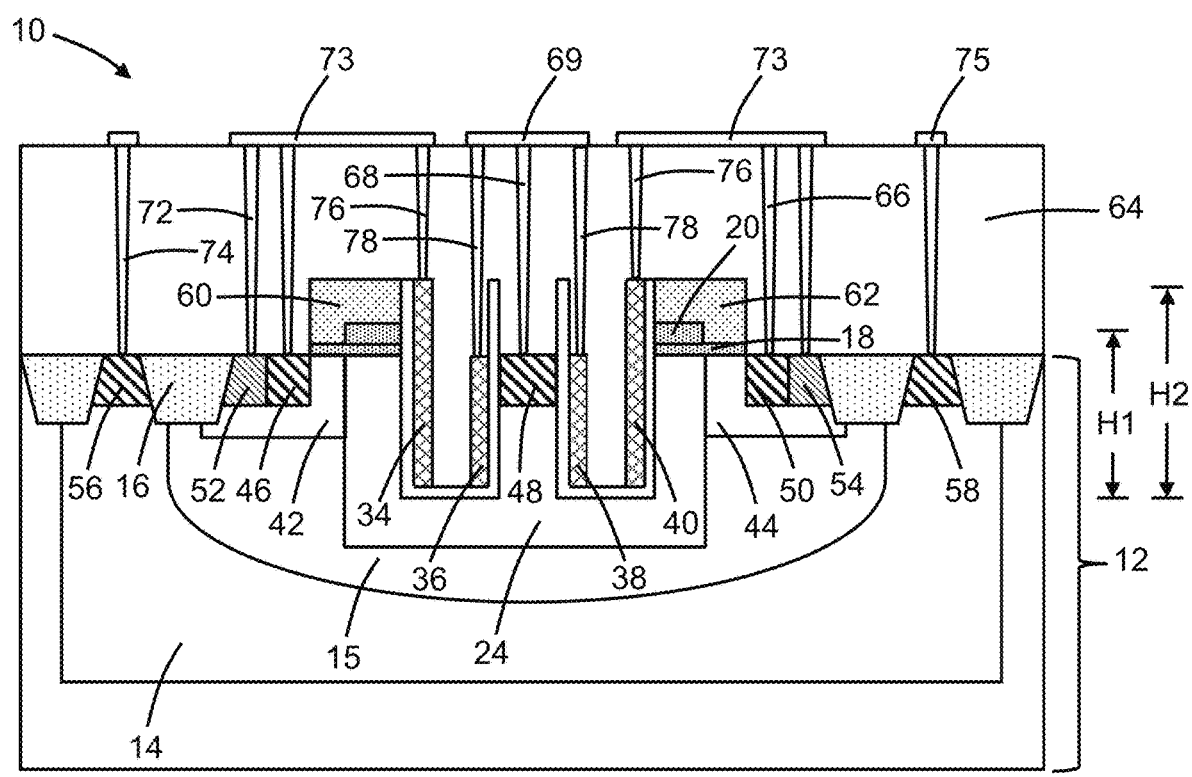
FIG. 7 is a cross-sectional view of a structure in accordance with alternative embodiments of the invention.

With reference to FIG. 7 and in accordance with alternative embodiments of the invention, the field plate 34 and the field plate 40 may be physically and electrically coupled by contacts 76 to the metal features 73. The field plate 34 may be coupled to the same metal feature 73 as the doped region 46 and the doped region 52. The field plate 40 may be coupled to the same metal feature 73 as the doped region 50 and the doped region 54. The field plate 36 and the field plate 38 may be physically and electrically coupled by contacts 78 to the metal feature 69 along with the doped region 48.

Connecting the field plate 34 to the doped region 46 representing one of the sources and the field plate 40 to the doped region 50 representing the other of the sources may be effective to reduce the surface potential and improve the device breakdown voltage. Connecting the field plate 36 and the field plate 38 to the doped region 48 representing the drain may be effective to reduce the peak voltage shifting to the drain at the high drain bias and high gate bias stage, which may improve the robustness of the laterally-diffused metal-oxide-semiconductor device.

Figure 8:
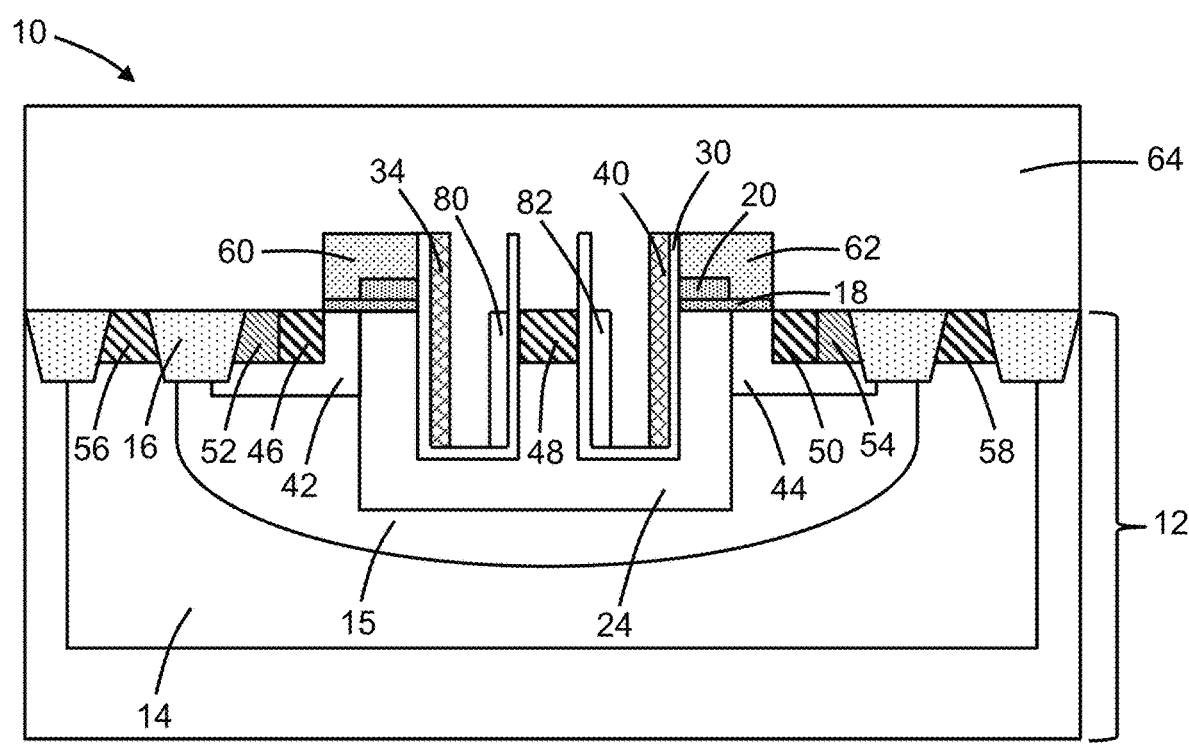
FIG. 8 is a cross-sectional view of a structure in accordance with alternative embodiments of the invention.

With reference to FIG. 8 and in accordance with alternative embodiments of the invention, the field plate 36 and the field plate 38 may be etched and removed to form respective cavities, and the cavities may be closed by the subsequently deposited dielectric layer 64 to form air gaps 80, 82 that are adjacent to the doped region 48 representing the drain. The doped region 48 is laterally positioned between the air gap 80 and the air gap 82, the air gap 80 is laterally positioned between the doped region 48 and the field plate 34, and the air gap 82 is laterally positioned between the doped region 48 and the field plate 40. The dielectric material of the dielectric layer 18 and the dielectric material of the dielectric layer 64 fully surround each of the air gaps 80, 82.

The air gaps 80, 82, which are unfilled by solid dielectric material, may be characterized by a permittivity or dielectric constant of near unity (i.e., vacuum permittivity). The air gaps 80 may be filled by atmospheric air at or near atmospheric pressure, may be filled by another gas at or near atmospheric pressure, or may contain atmospheric air or another gas at a sub-atmospheric pressure (e.g., a partial vacuum). The low permittivity of the air gaps 80, 82 may be effective to lower the parasitic capacitance.

The contacts 66, 68, 70, 72, 74 and metal features 67, 69, 71, 73, 75 may be subsequently formed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor device, the structure comprising:
   a semiconductor substrate including a first trench, the first trench having a bottom;
   a first source in the semiconductor substrate;
   a drain in the semiconductor substrate;
   a first gate laterally positioned between the first trench and the first source;
   a first field plate inside the first trench, the first field plate laterally positioned between the first gate and the drain;
   a second field plate inside the first trench in the semiconductor substrate; and
   a first gate dielectric between the first gate and the semiconductor substrate, the first gate dielectric including a first section adjacent to the first field plate and a second section adjacent to the first source, and the first section being thicker than the second section,
   wherein the first field plate and the second field plate have different heights relative to the bottom of the first trench.

2. The structure of claim 1 wherein the second field plate is laterally positioned between the first gate and the first field plate.

3. The structure of claim 2 wherein the first field plate has a first height relative to the bottom of the first trench, the second field plate has a second height relative to the bottom of the first trench, and the second height is greater than the first height.

4. The structure of claim 1 wherein the first field plate and the second field plate comprise polycrystalline silicon.

5. The structure of claim 1 further comprising:
   a plurality of dielectric layers inside the first trench, the plurality of dielectric layers comprising a dielectric material,
   wherein the first field plate and the second field plate are fully surrounded by the dielectric material.

6. The structure of claim 1 wherein the first trench has a first sidewall and a second sidewall, the first source is laterally positioned adjacent to the first sidewall of the first trench, the drain is laterally positioned adjacent to the second sidewall of the first trench, and the first gate is laterally positioned between the first sidewall of the first trench and the first source.

7. The structure of claim 1 wherein the semiconductor substrate includes a second trench, and further comprising:
a third field plate inside the second trench.

8. The structure of claim 7 wherein the drain is laterally positioned between the first field plate and the third field plate.

9. The structure of claim 7 further comprising:
a second source in the semiconductor substrate,
wherein the third field plate is laterally positioned between the second source and the drain.

10. The structure of claim 9 further comprising:
a second gate laterally positioned between the third field plate and the second source.

11. The structure of claim 10 wherein the third field plate is laterally positioned between the second gate and the drain.

12. The structure of claim 10 further comprising:
a second gate dielectric between the second gate and the semiconductor substrate, the second gate dielectric including a first section adjacent to the third field plate and a second section adjacent to the second source, and the first section being thicker than the second section.

13. The structure of claim 1 wherein the first trench has a sidewall, and the first section of the first gate dielectric has a side edge that is aligned with the sidewall.

14. The structure of claim 1 further comprising:
a drift well in the semiconductor substrate,
wherein the first trench is positioned within the drift well.

15. A structure for a laterally-diffused metal-oxide-semiconductor device, the structure comprising:
a semiconductor substrate including a trench;
a source in the semiconductor substrate;
a drain in the semiconductor substrate;
a gate laterally positioned between the trench and the source;
a field plate inside the trench, the field plate laterally positioned between the gate and the drain;
a gate dielectric between the gate and the semiconductor substrate, the gate dielectric including a first section adjacent to the field plate and a second section adjacent to the source, and the first section being thicker than the second section; and
a plurality of dielectric layers inside the trench, the plurality of dielectric layers comprising a dielectric material,
wherein the field plate is fully surrounded by the dielectric material.

16. The structure of claim 15 further comprising:
an air gap in the dielectric material.

17. The structure of claim 16 wherein the field plate is laterally positioned between the air gap and the gate.

18. The structure of claim 16 wherein the air gap is fully surrounded by the dielectric material.

19. The structure of claim 16 wherein the air gap is laterally positioned between the field plate and the drain.

20. A method of forming a structure for a laterally-diffused metal-oxide-semiconductor device, the method comprising:
forming a trench in a semiconductor substrate, wherein the trench has a bottom;
forming a source in the semiconductor substrate;
forming a drain in the semiconductor substrate;
forming a gate dielectric;
forming a gate laterally positioned between the trench and the source;
forming a first field plate inside the trench; and
forming a second field plate inside the trench,
wherein the first field plate and the second field plate have different heights relative to the bottom of the trench, the first field plate is laterally positioned between the gate and the drain, the gate dielectric is positioned between the gate and the semiconductor substrate, the gate dielectric includes a first section adjacent to the first field plate and a second section adjacent to the source, and the first section is thicker than the second section.

* * * * *